(12) United States Patent
Heo

(10) Patent No.: US 6,879,047 B1
(45) Date of Patent: Apr. 12, 2005

(54) STACKING STRUCTURE FOR SEMICONDUCTOR DEVICES USING A FOLDED OVER FLEXIBLE SUBSTRATE AND METHOD THEREFOR

(75) Inventor: Young Wook Heo, Phoenix, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 10/370,013

(22) Filed: Feb. 19, 2003

(51) Int. Cl.[7] .............................................. H01L 23/48
(52) U.S. Cl. ....................... 257/777; 257/778; 257/773; 257/685; 257/737; 257/723
(58) Field of Search ................. 257/777, 778, 257/773, 774, 685, 686, 737, 738, 723, 730

(56) References Cited

U.S. PATENT DOCUMENTS

| | | |
|---|---|---|
| 4,763,188 A | 8/1988 | Johnson |
| 5,012,323 A | 4/1991 | Faraworth |
| 5,025,306 A | 6/1991 | Johnson et al. |
| 5,291,061 A | 3/1994 | Ball |
| 5,323,060 A | 6/1994 | Fogal et al. |
| 5,347,429 A | 9/1994 | Kohno et al. |
| 5,422,435 A | 6/1995 | Takiar et al. |
| 5,463,253 A | 10/1995 | Waki et al. |
| 5,495,398 A | 2/1996 | Takiar et al. |
| 5,502,289 A | 3/1996 | Takiar et al. |
| 5,689,135 A | 11/1997 | Ball |
| 5,696,031 A | 12/1997 | Wark |
| 5,715,147 A | 2/1998 | Nagano |
| 5,721,452 A | 2/1998 | Fogal et al. |
| 5,739,581 A | 4/1998 | Chillara et al. |
| 5,815,372 A | 9/1998 | Gallas |
| 5,866,949 A | 2/1999 | Schueller |
| 5,886,412 A | 3/1999 | Fogal et al. |

(Continued)

FOREIGN PATENT DOCUMENTS

| | | |
|---|---|---|
| EP | 503 201 A2 | 12/1991 |
| JP | 56062351 | 5/1981 |
| JP | 60182731 | 9/1985 |
| JP | 61117858 | 6/1986 |
| JP | 62-126661 | 6/1987 |
| JP | 62126661 | 6/1987 |
| JP | 63128736 | 6/1988 |
| JP | 63-244654 | 10/1988 |

(Continued)

*Primary Examiner*—Nathan J. Flynn
*Assistant Examiner*—Remmon R. Fordé
(74) *Attorney, Agent, or Firm*—Weiss, Moy & Harris, P.C.

(57) ABSTRACT

A semiconductor stacking structure and method of producing the same has a flexible substrate. A plurality of apertures is formed on the flexible substrate. The plurality of apertures may be formed in groups for coupling semiconductor devices to the flexible substrate. A plurality of traces is formed on the flexible substrate for coupling the plurality of apertures together. A first semiconductor device is coupled to a first side of the flexible substrate. A first adhesive layer is placed on a first side of the flexible substrate for coupling the first semiconductor device to the first side of the flexible substrate. A plurality of contacts is coupled to a second side of the flexible substrate. The contacts and the first adhesive layer liquefy and flow into designated apertures when heated to couple the contacts to the first semiconductor device.

16 Claims, 5 Drawing Sheets

U.S. PATENT DOCUMENTS

| Patent | Kind | Date | Inventor | Ref |
|---|---|---|---|---|
| 5,973,403 | A | 10/1999 | Wark | |
| 6,005,778 | A | 12/1999 | Spielberger et al. | |
| 6,013,948 | A | 1/2000 | Akram et al. | |
| RE36,613 | E | 3/2000 | Ball | |
| 6,051,886 | A | 4/2000 | Fogal et al. | |
| 6,057,598 | A | 5/2000 | Payne et al. | |
| 6,072,243 | A | 6/2000 | Nakanishi | |
| 6,080,264 | A | 6/2000 | Ball | |
| 6,118,176 | A | 9/2000 | Tao et al. | |
| 6,133,637 | A | 10/2000 | Hikita et al. | |
| 6,140,149 | A | 10/2000 | Wark | |
| 6,157,080 | A | 12/2000 | Tamaki et al. | |
| 6,163,076 | A | 12/2000 | Lee et al. | |
| 6,214,641 | B1 | 4/2001 | Akram | |
| 6,215,193 | B1 | 4/2001 | Tao et al. | |
| 6,225,688 | B1 | 5/2001 | Kim et al. | |
| 6,252,305 | B1 | 6/2001 | Lin et al. | |
| 6,258,626 | B1 | 7/2001 | Wang et al. | |
| 6,300,679 | B1 * | 10/2001 | Mukerji et al. | 257/738 |
| 6,326,696 | B1 | 12/2001 | Horton et al. | |
| 6,333,562 | B1 | 12/2001 | Lin | |
| 6,359,340 | B1 | 3/2002 | Lin et al. | |
| 6,365,966 | B1 | 4/2002 | Chen et al. | |
| 6,387,728 | B1 | 5/2002 | Pai et al. | |
| 6,461,897 | B2 | 10/2002 | Lin et al. | |
| 2003/0168725 | A1 * | 9/2003 | Warner et al. | 257/686 |
| 2004/0056365 | A1 * | 3/2004 | Kinsman | 257/778 |
| 2004/0061213 | A1 * | 4/2004 | Karnezos | 257/686 |

FOREIGN PATENT DOCUMENTS

| | | |
|---|---|---|
| JP | 1028856 | 1/1989 |
| JP | 64001269 | 1/1989 |
| JP | 1071162 | 3/1989 |
| JP | 1099248 | 4/1989 |
| JP | 3169062 | 7/1991 |
| JP | 4028260 | 1/1992 |
| JP | 4-56262 | 2/1992 |
| JP | 4056262 | 2/1992 |
| JP | 62-56262 | 2/1992 |
| JP | 4096358 | 3/1992 |
| JP | 4116859 | 4/1992 |
| JP | 5013665 | 1/1993 |
| JP | 5-75015 A | 3/1993 |
| JP | 5109975 | 4/1993 |
| JP | 5136323 | 6/1993 |
| JP | 10-256470 | 9/1998 |

* cited by examiner

STACKING STRUCTURE FOR SEMICONDUCTOR DEVICES USING A FOLDED OVER FLEXIBLE SUBSTRATE AND METHOD THEREFOR

FIELD OF THE INVENTION

This invention relates to semiconductor devices and, more specifically, to a stacking structure for semiconductor devices which uses a folded over flexible substrate and a method therefor.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die or packages vertically in an IC package. Stacking multiple die or packages will maximize function and efficiency of the semiconductor package.

One method of stacking multiple die in an IC package is to use a folded over flexible substrate. In this method, a die and the other die are placed side by side on a flexible substrate. The flexible substrate is then folded over and the portion where the other die is placed covers the entire top surface of the die. In the case of more than two dies, the method is the same.

The above method is the current way of producing IC packages having multiple stacked die using a flexible substrate. However, there are several problems associated with using flexible substrates for producing IC packages having multiple stacked die. One problem is cost. Two metal layer flexible substrate tape is very expensive to use making certain packages cost prohibitive to the end user/client. Second, under current methods, connect density between dies is dramatically lower using a folded over substrate.

In order to provide high quality multi-chip stacked devices, the devices used for stacking must be either high yield FAB (i.e., memory devices) or known good die (KGD). Certain devices like ASIC and logic devices have a lower yield than devices like memory. Thus, these types of devices need to be screened if they are to be used in a multi-chip stacked device. A problem arises in that it is expensive to get a KGD prepared. Wafer component testing and burn-in testing is a very expensive process. However, testing of these types of devices is necessary in order to sort out potentially problematic chips and to prevent any quality and reliability issues.

Presently, there is a problem over the lack of known good die application into die stacking. If a logic or ASIC device is rejected after testing, the stack die coupled to these devices must be scraped. This is problematic to many end customers due to the cost of scraping good die which is stacked to a fail logic or ASIC device.

Therefore, a need existed to provide a device and method to overcome the above problems.

SUMMARY OF THE INVENTION

A semiconductor stacking structure and method of producing the same has a flexible substrate. A plurality of apertures is formed on the flexible substrate. The plurality of apertures may be formed in groups for coupling semiconductor devices to the flexible substrate. A plurality of traces is formed on the flexible substrate for coupling the plurality of apertures together. A first semiconductor device is coupled to a first side of the flexible substrate. A first adhesive layer or conductive paste is placed on a first side of the flexible substrate for coupling the first semiconductor device to the first side of the flexible substrate. A plurality of contacts is coupled to a second side of the flexible substrate. The contacts and the first adhesive layer liquefy and flow into designated apertures when heated to couple the contacts to the first semiconductor device.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
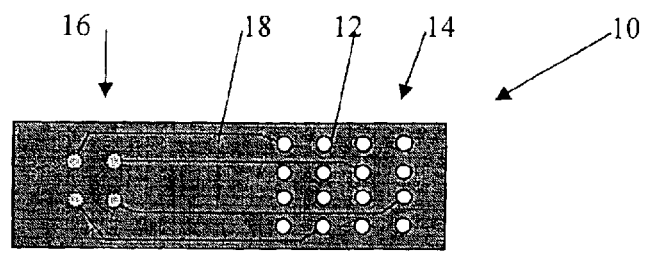
FIG. 1 is an elevated perspective view of one embodiment of a flexible substrate used in a stacking structure of the present invention.

Referring to FIG. 1, a flexible substrate 10 is shown. The flexible substrate 10 is used in the stacking structure of the present invention. The flexible substrate 10 is used to electrically couple two or more devices together in a stacked structure. The flexible substrate 10 may be a flex tape such as a polyamide or the like. The flexible substrate 10 will have one or more metal layers which are used for electrical connections. However, this is just one type of flexible substrate 10. The above references should not be seen as to limit the scope of the present invention.

The flexible substrate 10 will have a plurality of apertures 12. The apertures 12 are used to couple a device to the flexible substrate 10. The apertures 12 may be formed on the flexible substrate 10 in groups. Each of the groups is used to couple a specific device to the flexible substrate 10. For example, as may be seen in FIG. 1, a first group 14 of apertures 12 is formed on one end of the flexible substrate 10. A second group 16 of apertures 12 is formed on a second end of the flexible substrate 10. Additional groups of apertures 12 may be formed on the flexible substrate 10. The number of groups is generally based on the number of devices that will be coupled to the flexible substrate 10. The apertures 12 are coupled to one another by a plurality of traces 18. The traces 18 will allow different devices on the flexible substrate 10 to be coupled to one another.

Figure 2A:
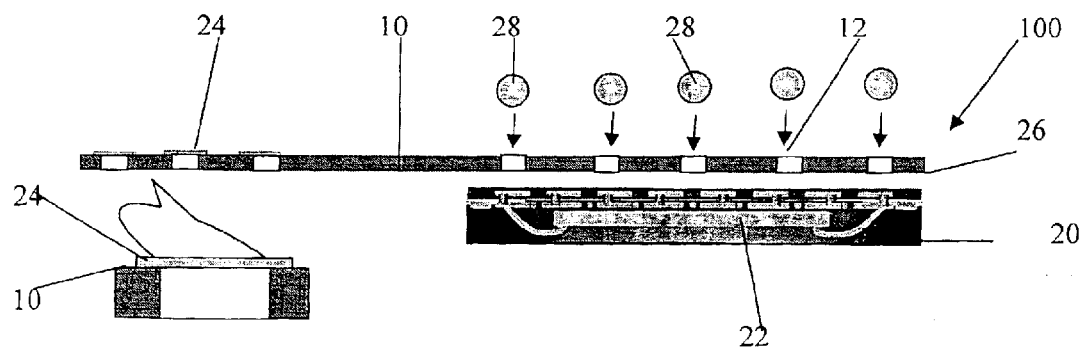
FIG. 2A is an explodes view of one embodiment of a stacking structure of the present invention.
Figure 2B:
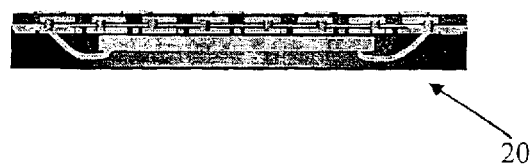
FIG. 2B is an elevated perspective view of the first prepackaged device used in the stacking structure of the present invention.
Figure 2C:
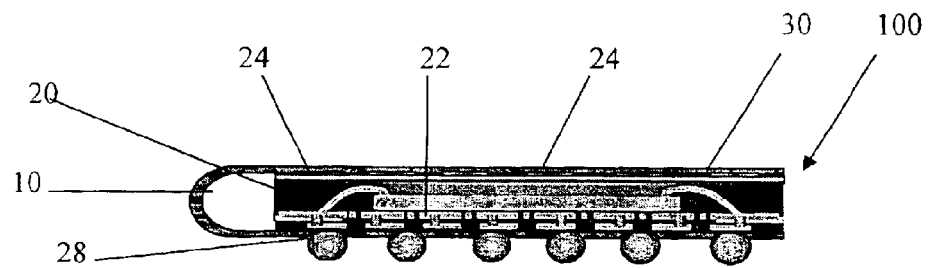
FIG. 2C is an elevated perspective view of the stacking structure depicted in FIG. 2A.

Referring now to FIGS. 2A–2C, one embodiment of a stacking structure for semiconductor devices 100 (hereinafter stacking structure 100) is shown. The stacking structure 100 has a device 20 which is coupled to the flexible substrate 16. The device 20 is a fully encapsulated package which has a semiconductor die 22. The semiconductor die 22 may be any type of device. For example, the semiconductor die 22 may be a memory device, a logic device, an ASIC device, and other like elements. It should be noted that the listing of the above types of semiconductor dies 22 is given as an example and should not be seen as to limit the scope of the present invention.

The stacking structure 100 may be a lead type of device, a Ball Grid Array (BGA) type of device, or a Land Grid Array (LGA) type of device In the embodiment depicted in FIG. 1A, the stacking structure 100 is a BGA type of package. However, this should not be seen as to limit the scope of the present invention.

The device 20 is coupled to the flexible substrate 16. As stated above, the apertures 12 are used to couple different devices 20 to the flexible substrate. The apertures 12 may be formed completely through the flexible substrate. Alternatively, a bond pad 24 may be positioned over the apertures 12. The bond pad 24 is generally a metal such as copper, nickel, gold plate and the like. The apertures 12 and location and use of the bond pads 24 are based on design choice. The use of bond pads 24 is based on design choice and the type of device to be coupled to the flexible substrate 10.

The device 20 is coupled to one side of the flexible substrate 16. A solder paste layer 26 may be applied to couple the device 20 to the flexible substrate 16. Electrical contacts 28 are positioned on an opposite side of the flexible substrate 16. The stacking structure 100 will then go through a reflow process. The reflow process will liquefy the solder paste layer 26 and the electrical contacts 28. The liquefied solder paste layer 26 and electrical contacts 28 will merge together in the apertures 12 thereby coupling the device 20 to the electrical contacts 28.

Referring now to FIG. 2C, the flexible substrate 16 is then folded over and coupled to a top surface of the device 20 to form the stacking structure 100. An adhesive layer 30 is used to couple the flexible substrate 16 to the top surface of the device 20. An adhesive film, paste or the like may be used as the adhesive layer 30. The listing of the above should not be seen as to limit the scope of the present invention.

Figure 3A:
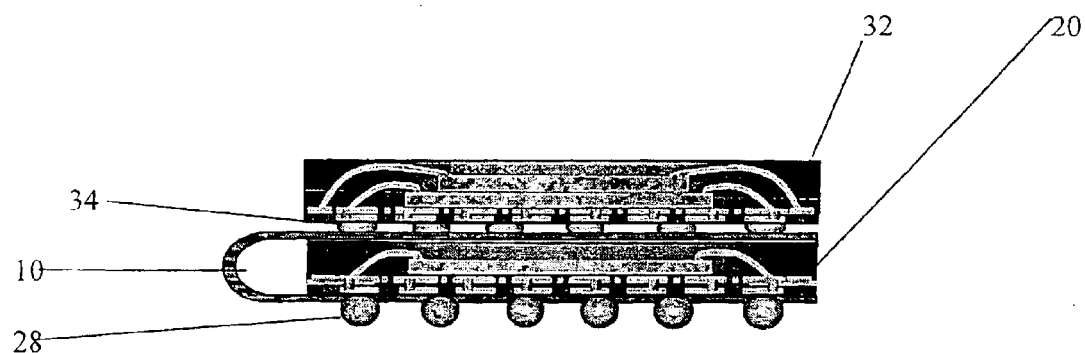
FIG. 3A is an elevated perspective view of the stacking structure depicted in FIG. 2B with a second device stacked on top of the stacking structure.

Referring to FIG. 3A, a second device 32 is coupled to the stacking structure 100. The second device 32 is generally a prepackaged device. The second device 32 is generally a different type of prepackaged device than that of the first device 20. To couple the second device 32 to the stacking structure 100, contacts 34 on the second device 32 will engage the bond pads 24 on the flexible substrate 10. This will allow the second device 32 to be electrically coupled to the first device 12.

Figure 3B:
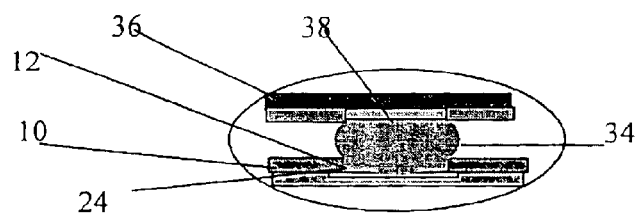
FIG. 3B is a close-up view of the connection between the second device and the stacking structure depicted in FIG. 3A.

Referring to FIG. 3B, a close-up view of the connection between the second device 32 and the flexible substrate 10 is shown. The contact 34 of the second device 32 is coupled to a bond pad 38 on a substrate 36. This will allow for an electrical connection between a die of the second device and the contact 34. Each of the contacts 34 of the second device 32 will be position within a corresponding aperture 12. Each contact 34 will be coupled to a bond pad 24. Each bond pad 24 is coupled to the flexible substrate 10. This will allow the second device 32 to be electrically coupled to the first device 20.

Figures 3C, 3D:
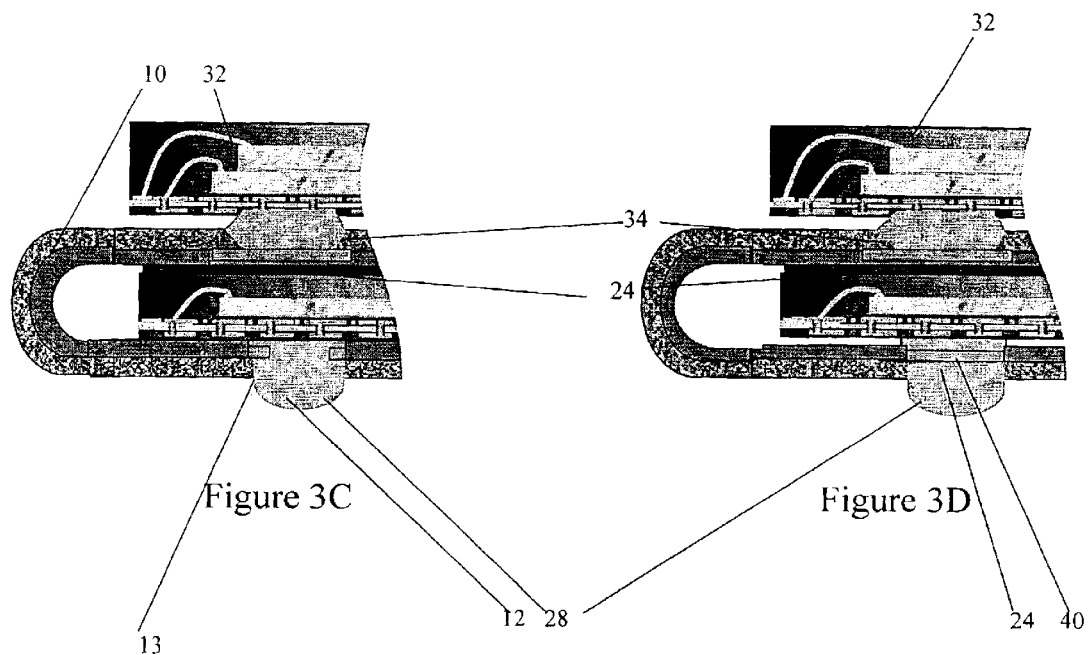
FIG. 3C is a close-up view of one embodiment of the connection between an electrical connector and the first device of the stacking structure depicted in FIG. 3A.
FIG. 3D is a close-up view of another embodiment of the connection between an electrical connector and the first device of the stacking structure depicted in FIG. 3A.

Referring now to FIG. 3C, a close-up view of the connections between the second device 32 and the flexible substrate 10 and the connection between the first device 12 and the flexible substrate 10. In this embodiment, the connections between the second device 32 and the flexible substrate 10 is the same as that described above. Each of the contacts 34 of the second device 32 will be position within a corresponding aperture 12. Each contact 34 will be coupled to a bond pad 24 which is further coupled to the flexible substrate 10. This will allow the second device 32 to be electrically coupled to the first device 20. For the connection between the first device 20 and the flexible substrate 10, the aperture 12 is formed completely through the flexible substrate 10. The electrical contacts 28 are positioned on an opposite side of the flexible substrate 16. During a reflow process, the electrical contacts 28 attached to the prepackaged device 20, which in this embodiment are solder balls, will liquefy. The liquefied solder balls will become electrical contacts 28 in the apertures after getting down through via holes of tape substrate 10 with ball pad center holed 13 thereby coupling the first device to the electrical contacts 28 automatically.

Referring now to FIG. 3E, a close-up view of the connections between the second device 32 and the flexible substrate 10 and the connection between the first device 12 and the flexible substrate 10. In this embodiment, the connections between the second device 32 and the flexible substrate 10 is the same as that described above. Each of the contacts 34 of the second device 32 will be position within a corresponding aperture 12. Each contact 34 will be coupled to a bond pad 24 which is further coupled to the flexible substrate 10. This will allow the second device 32 to be electrically coupled to the first device 20. For the connection between the first device 20 and the flexible substrate 10, a bond pad 24 is positioned across the aperture 12. Contacts 40 on the first device 20 are electrically coupled to the bond pad 24. The electrical contacts 28 are then electrically coupled to the bond pad 24 thereby coupling the first device 20 to the electrical contacts 28.

Figure 4A:
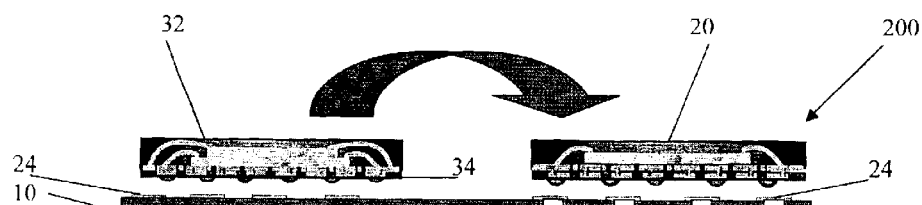
FIG. 4A is an exploded view of another embodiment of the stacking structure of the present invention.

Referring to FIG. 4A, another embodiment of a stacking structure 200 is shown. In this embodiment, the flexible substrate 10 is similar to the flexible substrate 10 disclosed above. The flexible substrate 10 will have a plurality of apertures 12. The apertures 12 may be formed on the flexible substrate 10 in groups. Each of the groups is used to couple a specific device to the flexible substrate 10. Some of the apertures 12 may have bond pads 24 coupled thereto. Alternatively, bond pads 24 may be directly coupled to the flexible substrate 10. The use of bond pads 24 is based on design choice and the type of device to be coupled to the flexible substrate 10. The apertures 12 and the bond pads 24 are coupled to one another by a plurality of traces 18. The traces 18 will allow different devices on the flexible substrate 10 to be coupled to one another. In the embodiment depicted in FIG. 4A, the flexible substrate 10 has a group of apertures 12 with bond pads 24 coupled thereto on one side and a group of bond pads 24 coupled to the flexible substrate 10 on an opposite side. The group of apertures 12 with bond pads 24 and the bond pads located opposite are coupled together with traces 18.

In the embodiment depicted in FIG. 4A, a first device 20 and a second device 32 are coupled to the flexible substrate 10. The first device 20 and the second device 32 can be coupled to the flexible substrate 10 in a variety of different manners.

Figure 4B:
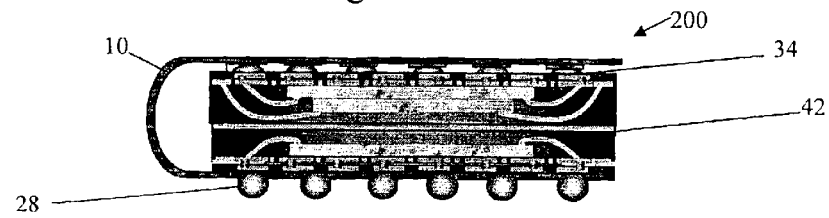
FIG. 4B is an elevated perspective view of the stacking structure depicted in FIG. 4A.

Referring to FIG. 4B, once the first device 20 and the second device 32 are coupled to the flexible substrate 10, the flexible substrate 10 is folded over. An adhesive layer 42 is applied to the top surface of the devices 20 and 32 to couple the top surfaces of devices 20 and 32 together. The stacking structure 200 may further have electrical contacts 28. The electrical contacts 28 are generally coupled to the first device 20 in a similar manner as disclosed above. The electrical contacts 28 are inserted into the aperture 12. The electrical contacts 28 will come in contact with the corresponding bond pad 24 forming an electrical contact between the first device 20 and the electrical contacts. The stacking structure 200 depicted in FIGS. 4A and 4B is best used where heat dissipation is not an issue.

Figure 4C:
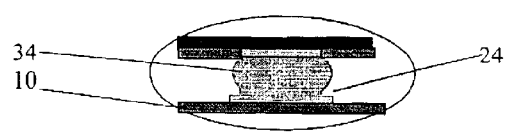
FIG. 4C is a close-up view of the connection between the second device and the flexible substrate depicted in FIG. 4B.

Referring to FIG. 4C, a close-up view of the connection between the second device 32 and the flexible substrate 10 is shown. The contact 34 of the second device 32 is coupled to a bond pad 38 on a substrate 36. This will allow for an electrical connection between a die of the second device and the contact 34. Each contact 34 will be coupled to a bond pad 24 coupled to the flexible substrate 10. This will allow the second device 32 to be electrically coupled to the first device 20.

Figure 4D:
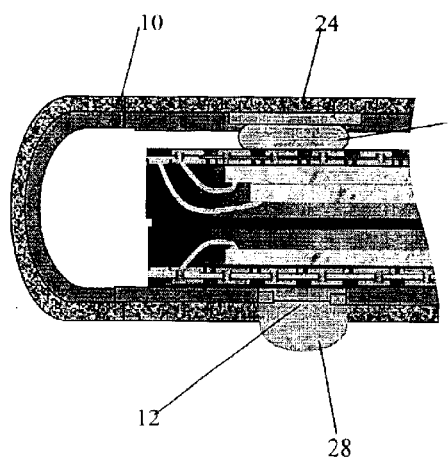
FIG. 4D is a close-up view of one embodiment of the connection between an electrical connector and the first device of the stacking structure depicted in FIG. 4B.

Referring now to FIG. 4D, a close-up view of the connections between the second device 32 and the flexible substrate 10 and the connection between the first device 12 and the flexible substrate 10. In this embodiment, the connections between the second device 32 and the flexible substrate 10 are as follows. Each contact 34 is coupled to a bond pad 24 which is further coupled to the flexible substrate 10. This will allow the second device 32 to be electrically coupled to the first device 20. For the connection between the first device 20 and the flexible substrate 10, the aperture 12 is formed completely through the flexible substrate 10. The electrical contacts 28 are positioned on an opposite side of the flexible substrate 16 from the first device 20. During a reflow process, the solder paste layer 26 and the electrical contacts 28 will liquefy. The liquefied solder paste layer 26 and electrical contacts 28 will merge together in the apertures 12 thereby coupling the first device 20 to the electrical contacts 28.

Figure 4E:
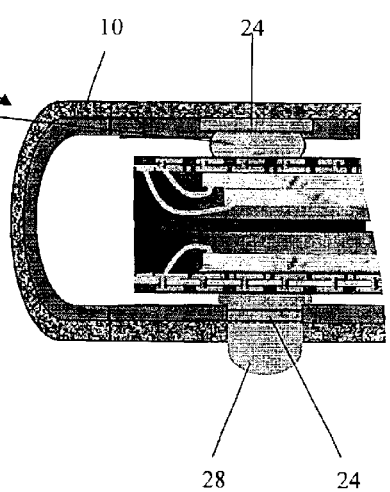
FIG. 4E is a close-up view of another embodiment of the connection between an electrical connector and the first device of the stacking structure depicted in FIG. 4B.

Referring now to FIG. 4E, a close-up view of the connections between the second device 32 and the flexible substrate 10 and the connection between the first device 12 and the flexible substrate 10. In this embodiment, the connections between the second device 32 and the flexible substrate 10 is the same as that described above. Each contact 34 is coupled to a bond pad 24 which is further coupled to the flexible substrate 10. This will allow the second device 32 to be electrically coupled to the first device 20. For the connection between the first device 20 and the flexible substrate 10, a bond pad 24 is positioned across the aperture 12. Contacts 40 on the first device 20 are electrically coupled to the bond pad 24. The electrical contacts 28 are then electrically coupled to the bond pad 24 thereby coupling the first device 20 to the electrical contacts 28.

Figure 5:
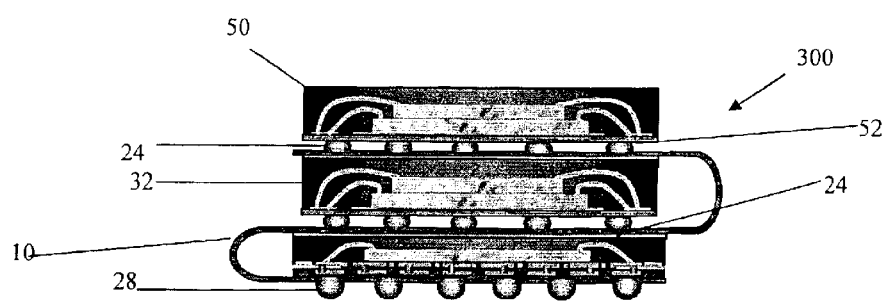
FIG. 5 is a front view of another embodiment of the stacking structure of the present invention.

Referring to FIG. 5, another embodiment of the stacking structure 300 is shown. The stacking structure 300 is very similar to that shown in FIGS. 3A–3D. The main difference is that in FIG. 5 any additional package is stacked on top of the second device 32. The third device 50 is generally a prepackaged device. The third device 50 may be coupled to the flexible substrate 10 in a plurality of different manners. Different combinations of apertures 12 and bond pads 24 in combination or by themselves may be used. In the embodiment depicted in FIG. 5, to couple the third device 50 to the stacking structure 300, additional bond pads 24 are coupled to the flexible substrate 10 in a manner similar to that described above. Contacts 52 on the third device 50 will engage the bond pads 24 on the flexible substrate 10. This will allow the third device 50 to be electrically coupled to the first device 20 and the second device 32. It should be noted that additional packages may be coupled to the stacking structure 300 without departing from the spirit and scope of the present invention.

Figure 6:
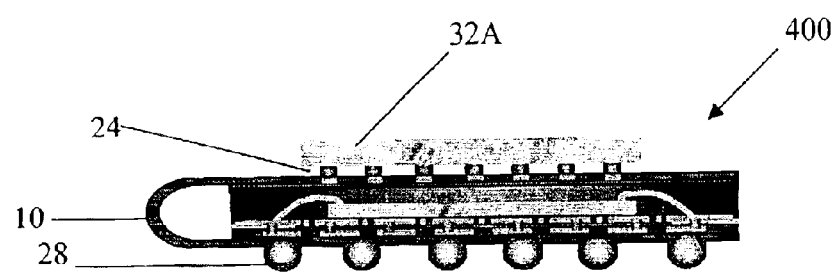
FIG. 6 is a front view of another embodiment of the stacking structure of the present invention.

Referring to FIG. 6, another embodiment of a stacking structure 400 is shown. The stacking structure 400 is similar to that shown in FIGS. 3A–3D. The main difference is that the second device 32 is a flip chip 32A. The flip chip 32A has contacts 34 coupled to bond pads 24 on the flexible substrate 10. In this embodiment, there is no under filling of the flip chip 32A.

Figure 7:
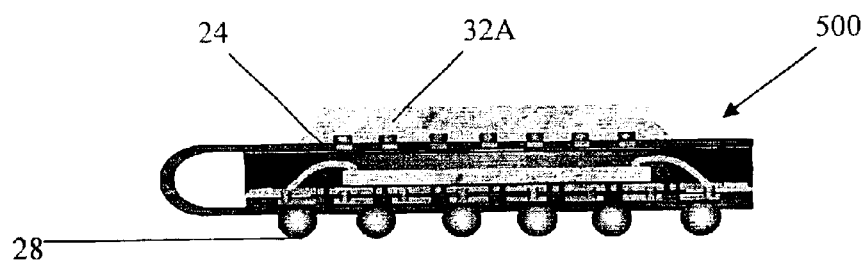
FIG. 7 is a front view of another embodiment of the stacking structure of the present invention.

Referring to FIG. 7, another embodiment of a stacking structure 500 is shown. The stacking structure 500 is similar to that shown in FIG. 6. The main difference is that there is under filling of the flip chip 32A.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor stacking structure comprising:
    a flexible substrate;
    a plurality of apertures formed on the flexible substrate wherein the plurality of apertures are formed in groups for coupling semiconductor packages to the flexible substrate;
    a plurality of traces for coupling the plurality of apertures together;
    a first semiconductor package coupled to a first side of the flexible substrate; and
    a first adhesive layer for coupling the first semiconductor package to the first side of the flexible substrate.

2. A semiconductor stacking structure in accordance with claim 1 further comprising a second adhesive layer which is placed on a top surface of the first semiconductor package to couple the flexible substrate to the top surface of the first semiconductor package when the flexible substrate is folded.

3. A semiconductor stacking structure in accordance with claim 1 further comprising a plurality of bond pads coupled to the flexible substrate for coupling the semiconductor packages to the flexible substrate.

4. A semiconductor stacking structure in accordance with claim 3 wherein the bond pads are coupled to selected apertures on the flexible substrate.

5. A semiconductor stacking structure package in accordance with claim 1 wherein the first adhesive layer is one of a solder paste or conductive paste.

6. A semiconductor stacking structure comprising:
   a flexible substrate;
   a plurality of apertures formed on the flexible substrate;
   a first semiconductor package coupled to a first side of the flexible substrate and positioned over the plurality of apertures;
   a plurality of bond pads coupled to the flexible substrate for stacking additional semiconductor packages on the flexible substrate;
   a plurality of traces coupling the plurality of apertures and the plurality of bond pads; and
   a first adhesive layer for coupling the first semiconductor package to the first side of the flexible substrate.

7. A semiconductor stacking structure comprising:
   a flexible substrate;
   a plurality of apertures formed on the flexible substrate wherein the plurality of apertures are formed in groups for coupling semiconductor packages to the flexible substrate;
   a plurality of traces for coupling the plurality of apertures together;
   a first semiconductor package coupled to a first side of the flexible substrate;
   means for coupling the first semiconductor device to the first side of the flexible substrate; and
   means placed on a top surface of the first semiconductor device for coupling the flexible substrate to the top surface of the first semiconductor device when the flexible substrate is folded.

8. A semiconductor stacking structure in accordance with claim 7 further comprising bond pads coupled to selected apertures on the flexible substrate.

9. A semiconductor stacking structure comprising:
   a flexible tape substrate having a plurality of apertures formed thereon;
   metal traces formed on the flexible tape substrate for coupling the plurality of apertures together;
   a first semiconductor package coupled to a first side of the flexible tape substrate;
   a first adhesive layer for coupling the first semiconductor package to the first side of the flexible tape substrate;
   a plurality of bond pads coupled to the flexible tape substrate for coupling another semiconductor package to the flexible tape substrate after the flexible tape substrate is folded onto the first semiconductor package; and
   a plurality of contacts coupled to a second side of the flexible tape substrate.

10. A semiconductor stacking structure in accordance with claim 9 further comprising a second adhesive layer which is placed on a top surface of the first semiconductor package to couple the flexible substrate to the top surface of the first semiconductor package when the flexible substrate is folded.

11. A semiconductor stacking structure in accordance with claim 9 wherein the bond pads are coupled to selected apertures on the flexible substrate.

12. A semiconductor stacking structure package in accordance with claim 9 wherein the first adhesive layer is one of a solder paste or conductive paste.

13. A semiconductor stacking structure comprising:
   a flexible substrate having a plurality of apertures formed thereon, the plurality of apertures are formed on a first end and a second end of the flexible substrate;
   metal traces formed of the flexible substrate to couple the plurality of apertures together;
   a first semiconductor package positioned over the plurality of apertures formed on the first end of the flexible substrate;
   a first adhesive layer for coupling the first semiconductor package over the plurality of apertures formed on the first end of the flexible substrate; and
   a plurality of bond pads coupled to the plurality of apertures formed on the second end of the flexible substrate for coupling another semiconductor package to the flexible substrate.

14. A semiconductor stacking structure in accordance with claim 13 further comprising a plurality of contacts coupled to a second side of the flexible substrate and to the first semiconductor package.

15. A semiconductor stacking structure in accordance with claim 13 further comprising a second adhesive layer which is placed on a top surface of the first semiconductor package to couple the flexible substrate to the top surface of the first semiconductor package when the flexible substrate is folded.

16. A semiconductor stacking structure package in accordance with claim 13 wherein the first adhesive layer is one of a solder paste or conductive paste.

* * * * *